(12) United States Patent
Lee et al.

(10) Patent No.: US 8,937,933 B2
(45) Date of Patent: *Jan. 20, 2015

(54) METHOD AND APPARATUS FOR TRANSMITTING PLCP FRAME IN WIRELESS LOCAL AREA NETWORK SYSTEM

(71) Applicant: LG Electronics Inc., Seoul (KR)

(72) Inventors: Dae Won Lee, Anyang-si (KR); Dong Wook Roh, Anyang-si (KR); Byeong Woo Kang, Anyang-si (KR); Yong Ho Seok, Anyang-si (KR); Yu Jin Noh, Anyang-si (KR); Bong Hoe Kim, Anyang-si (KR)

(73) Assignee: LG Electronics Inc., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/943,572

(22) Filed: Jul. 16, 2013

(65) Prior Publication Data

US 2013/0336257 A1 Dec. 19, 2013

Related U.S. Application Data

(63) Continuation of application No. 12/941,974, filed on Nov. 8, 2010, now Pat. No. 8,681,757.

(60) Provisional application No. 61/259,576, filed on Nov. 9, 2009, provisional application No. 61/285,917, filed on Dec. 11, 2009.

(30) Foreign Application Priority Data

May 18, 2010 (KR) .................. 10-2010-0046256

(51) Int. Cl.
*H04W 4/00* (2009.01)
*H04W 84/12* (2009.01)
*H04L 27/26* (2006.01)
*H04L 1/00* (2006.01)
*H04W 28/06* (2009.01)

(52) U.S. Cl.
CPC ............ *H04W 84/12* (2013.01); *H04L 27/2613* (2013.01); *H04L 1/0041* (2013.01); *H04L 1/0061* (2013.01); *H04W 28/06* (2013.01)
USPC ......................................... 370/338

(58) Field of Classification Search
CPC .............................. H04W 84/18; H04W 84/12
USPC ................................. 370/338, 328
See application file for complete search history.

(56) References Cited

U.S. PATENT DOCUMENTS

| | | |
|---|---|---|
| 2008/0052604 A1 | 2/2008 | Karaoguz et al. |
| 2009/0252110 A1 | 10/2009 | Sridhara et al. |
| 2010/0260138 A1 | 10/2010 | Liu et al. |
| 2011/0051705 A1 | 3/2011 | Jones et al. |
| 2011/0305296 A1 | 12/2011 | Van Nee |

*Primary Examiner* — Shripal Khajuria
(74) *Attorney, Agent, or Firm* — Lee, Hong, Degerman, Kang & Waimey

(57) ABSTRACT

A method of transmitting a Physical Layer Convergence Procedure (PLCP) frame in a Very High Throughput (VHT) Wireless Local Area Network (WLAN) system includes generating a MAC Protocol Data Unit (MPDU) to be transmitted to a destination station (STA), generating a PLCP Protocol Data Unit (PPDU) by adding a PLCP header, including an L-SIG field containing control information for a legacy STA and a VHT-SIG field containing control information for a VHT STA, to the MPDU, and transmitting the PPDU to the destination STA. A constellation applied to some of Orthogonal Frequency Division Multiplex (OFDM) symbols of the VHT-SIG field is obtained by rotating a constellation applied to an OFDM symbol of the L-SIG field.

5 Claims, 9 Drawing Sheets

METHOD AND APPARATUS FOR TRANSMITTING PLCP FRAME IN WIRELESS LOCAL AREA NETWORK SYSTEM

CROSS-REFERENCE TO RELATED APPLICATIONS

This application is a continuation of U.S. application Ser. No. 12/941,974, filed on Nov. 8, 2010, now U.S. Pat. No. 8,681,757, which, pursuant to 35 U.S.C. §119, claims the benefit of earlier filing date and right of priority to Korean Application No. 10-2010-0046256, filed on May 18, 2010, and also claims the benefit of U.S. Provisional Application Ser. Nos. 61/259,576, filed on Nov. 9, 2009, and 61/285,917, filed on Dec. 11, 2009, the contents of which are all hereby incorporated by reference herein in their entirety.

BACKGROUND OF THE INVENTION

1. Field of the Invention

The present invention relates to wireless communication, and more particularly, to a method of transmitting a PLCP frame in a WLAN system and a wireless apparatus supporting the method.

2. Related Art

With the recent development of information communication technology, a variety of wireless communication techniques are being developed. From among them, a WLAN is a technique which enables wireless access to the Internet at homes or companies or in specific service providing areas through mobile terminals, such as a Personal Digital Assistant (PDA), a laptop computer, and a Portable Multimedia Player (PMP), on the basis of radio frequency technology.

Since Institute of Electrical and Electronics Engineers (IEEE) 802 (i.e., the standard organization of WLAN technology) was set up on February, 1980, lots of standardization tasks are being performed.

The initial WLAN technology was able to support the bit rate of 1 to 2 Mbps through frequency hopping, band spreading, and infrared communication by using a 2.4 GHz frequency band in accordance with IEEE 802.11, but the recent WLAN technology can support a maximum bit rate of 54 Mbps by using Orthogonal Frequency Division Multiplex (OFDM). In addition, in the IEEE 802.11, the standardization of various techniques, such as the improvements of Quality of Service (QoS), the compatibility of Access Point (AP) protocols, security enhancement, radio resource measurement, wireless access vehicular environment for vehicle environments, fast roaming, a mesh network, interworking with an external network, and wireless network management, is put to practical use or being developed.

Furthermore, as a technique for overcoming limits to the communication speed considered as vulnerabilities in the WLAN, there is IEEE 802.11n which has recently been standardized. The object of the IEEE 802.11n is to increase the speed and reliability of a network and to expand the coverage of a wireless network. More particularly, the IEEE 802.11n is based on a Multiple Inputs and Multiple Outputs (MIMO) technique using multiple antennas on both sides of a transmitter and a receiver in order to support a High Throughput (HT) having a data processing speed of 540 Mbps or higher, minimize transmission errors, and optimize the data rate. Further, the IEEE 802.11n may use not only a coding method of transmitting several redundant copies in order to increase data reliability, but also an Orthogonal Frequency Division Multiplex (OFDM) method in order to increase the data rate.

In addition to a PLCP format supporting legacy STAs, an HT green field PLCP format (that is, a PLCP format efficiently designed for HT STAs) which can be used in a system composed of HT STAs supporting IEEE 802.11n has been introduced into the IEEE 802.11n HT (High Throughput) WLAN system. Furthermore, the IEEE 802.11n HT (High Throughput) WLAN system supports an HT mixed PLCP format which is a PLCP format designed to support an HT system in a system in which legacy STAs and HT STAs coexist.

In the HT mixed PLCP frame, an HT-SIG field is subjected to encoding and interleaving processes and then mapped for modulation. Here, a QBPSK constellation is used. The QBPSK constellation is a constellation shifted from a BPSK constellation by 90°. An HT-SIG field can be simply detected because an L-SIG field uses a common BPSK constellation.

For detailed information about the HT green field PLCP format and the HT mixed PLCP format, reference can be made to "IEEE P802.11n™/D11.0, Draft STANDARD for Information Technology-Telecommunications and Information Exchange Between Systems-Local and Metropolitan Area Networks-Specific Requirements Part 11: Wireless LAN Medium Access Control (MAC) and Physical Layer (PHY) Specifications Amendment 5: Enhancements for Higher Throughput, Clause 20. High Throughput PHY specification" disclosed on June, 2009.

In IEEE 802.11n, 8 bits for CRC check are allocated to the HT-SIG field, thereby being capable of protecting 0-33 bits (0-23 bits are an HT-SIG1 field and 0-9 bits are an HT-SIG2 field) from among 48 bits. In the CRC operation, after a shift register is set to an initial value, input bits are sequentially calculated through the shift register, and the last bit enters the shift register. After all operations are finished, bits remaining in the shift register are obtained as outputs. For example, assuming that (m0 . . . m33)={1 1 1 1 0 0 0 1 0 0 1 0 0 1 1 0 0 0 0 0 0 0 0 1 1 1 0 0 0 0 0 0 0 0}, CRC bits {c7 . . . c0}={1 0 1 0 1 0 0 0}.

When an HT STA detects the HT-SIG field of an HT mixed PLCP frame, two kinds of operations are possible in addition to a mode in which the HT-SIG field is normally read and operated. The HT STA can be operated in the legacy mode because it has recognized that the HT-SIG field is not the HT-SIG field or, although it has recognized that the HT-SIG field is the HT-SIG field, can inform CRC error through PHY-RXEDN.indication (Format Violation) without transmitting PHY-RXSTART.indication because of errors detected as the result of the CRC execution. At this time, the HT PHY terminal maintains PHY-CCA.indication (BUSY, channel-list) until a received level drops less than a specific CCA sensitivity level (e.g., an energy detection threshold) indicating an idle channel.

In each of the OFDM symbols of a 20 MHz channel of IEEE 802.11n, four subcarriers are composed of a pilot signal. This is for coherent detection robust to frequency offset and phase noise. The pilot signal can be modulated into a BPSK constellation, placed in indices −21, −7, 7, 21, and represented by {0,0, . . . , 0,1, 0, . . . , 0,1, 0, . . . , 0,1, 0, . . . , 0, −1, 0, . . . , 0}. Meanwhile, the pilot subcarriers are scrambled by a sequence Pn.

With the WLAN being widely spread and applications using the WLAN becoming diverse, a need for a new WLAN system capable of supporting a higher throughput than the data processing speed supported by the IEEE 802.11n is recently gathering strength. A Very High Throughput (VHT) WLAN system is one of the IEEE 802.11 WLAN systems which have recently been proposed in order to support a data processing speed of 1 Gbps or higher.

In IEEE 802.11 TGac in which the standardization of a VHT WLAN system is being carried out, in order to provide the throughput of 1 Gbps or higher, research is being done on a scheme using 8×8 MIMO and a channel bandwidth of 80 MHz or higher and a PLCP format for efficiently supporting each STA in a WLAN system in which a legacy STA, an HT STA, and a VHT STA coexist. As part of improving the performance of an SU-MIMO mode introduced in IEEE 802.11n and an MU-MIMO mode to be newly introduced into the VHT WLAN system, a method of configuring a PLCP frame format capable of effectively supporting the SU-MIMO mode and the MU-MIMO mode and guaranteeing the coexistence by preventing the malfunction of the legacy STA and the HT STA, and a wireless apparatus supporting the method need to be taken into consideration.

SUMMARY OF THE INVENTION

An object of the present invention is to provide a method of configuring a PLCP frame which is capable of improving the performance of SU-MIMO and of supporting MU-MIMO in a WLAN system in which an L STA, an HT STA, and a VHT STA coexist and an apparatus supporting the method.

Another object of the present invention is to provide a PLCP frame format which is capable of reducing preamble overhead and also preventing the malfunction of an HT STA in a WLAN system in which a legacy STA, the HT STA, and a VHT STA coexist.

In an aspect of the present invention, a method of transmitting a Physical Layer Convergence Procedure (PLCP) frame in a Wireless Local Area Network (WLAN) system is provided, the method includes generating a MAC Protocol Data Unit (MPDU) to be transmitted to a destination station (STA), generating a PLCP Protocol Data Unit (PPDU) by adding a PLCP header, comprising an L-SIG field containing control information for a legacy STA and a VHT-SIG field containing control information for a VHT STA, to the MPDU, and transmitting the PPDU to the destination STA, wherein a constellation applied to some of Orthogonal Frequency Division Multiplex (OFDM) symbols of the VHT-SIG field is obtained by rotating a constellation applied to an OFDM symbol of the L-SIG field.

The L-SIG field may be transmitted as one OFDM symbol, and the OFDM symbol of the L-SIG field may be mapped to a BPSK constellation.

The OFDM symbols of the VHT-SIG field may include two OFDM symbols of VHT-SIG1 and VHT-SIG2, and the VHT-SIG1 symbol may be modulated by using the same method and constellation as the OFDM symbol of the L-SIG field.

The L-SIG field may be transmitted as one OFDM symbol, the OFDM symbol of the L-SIG field may be mapped to a BPSK constellation, and the VHT-SIG field may be transmitted as two OFDM symbols of VHT-SIG1 and VHT-SIG2, the OFDM symbol of the VHT-SIG1 may be mapped to a BPSK constellation and the OFDM symbol of the VHT-SIG2 is mapped to a QBPSK constellation.

The OFDM symbols of the VHT-SIG field may include three OFDM symbols of VHT-SIG1, VHT-SIG2, and VHT-SIG3, and the VHT-SIG1 symbol may be modulated by using the same method and constellation as the OFDM symbol of the L-SIG field.

The OFDM symbol of the VHT-SIG field may include a VHT pilot signal, and the VHT pilot signal may be mapped to a constellation obtained by rotating a constellation applied to a pilot signal included in the OFDM symbol of the L-SIG field.

The pilot signal included in the OFDM symbol of the L-SIG field may be mapped to a BPSK constellation.

The VHT pilot signal may be mapped to a BPSK constellation rotated 180°.

In another aspect of the present invention, a method of configuring a PLCP frame in a WLAN system is provided, the method includes generating an MPDU to be transmitted to a destination STA, generating a PPDU by adding a PLCP header, comprising an L-SIG field containing control information for a legacy STA and a VHT-SIG field containing control information for a VHT STA, to the MPDU, and transmitting the PPDU to the destination STA, wherein an L-CRC bit string used in a Cyclic Redundancy Check (CRC) of the destination STA and included in the L-SIG field and a VHT-CRC bit string the CRC of the destination STA and included in the VHT-SIG field are obtained on the basis of different CRC polynomials.

DESCRIPTION OF EXEMPLARY EMBODIMENTS

Some embodiments of the present invention are described in detail below with reference to the accompanying drawings.

A WLAN (wireless local area network) system in which the embodiments of the present invention are implemented includes at least one Basic Service Set (BSS). The BSS is a set of stations (STAs) successfully synchronized for communication. The BSS can be classified into an Independent BSS (IBSS) and an Infrastructure BSS.

The BSS includes at least one STA and an Access Point (AP). The AP is a medium providing connection through the wireless medium of each STA within the BSS. The AP can be called another terminology, such as a centralized controller, a Base Station (BS), or a scheduler.

An STA is a certain function medium including a MAC (medium access control) and PHY (wireless-medium physical layer) interface which satisfies the IEEE 802.11 standard. The STA can be an AP or a non-AP STA, but refers to a non-AP STA unless described otherwise. The STA can be called another terminology, such as User Equipment (UE), a Mobile Station (MS), a Mobile Terminal (MT), a portable device, or an interface card.

STAs can be classified into a VHT-STA, an HT-STA, and a Legacy (L)-STA. The HT-STA refers to an STA supporting IEEE 802.11n, and the L-STA refers to an STA supporting a lower version of IEEE 802.11n (e.g., IEEE 802.11a/b/g). The L-STA is called a non-HT STA.

Figure 1:
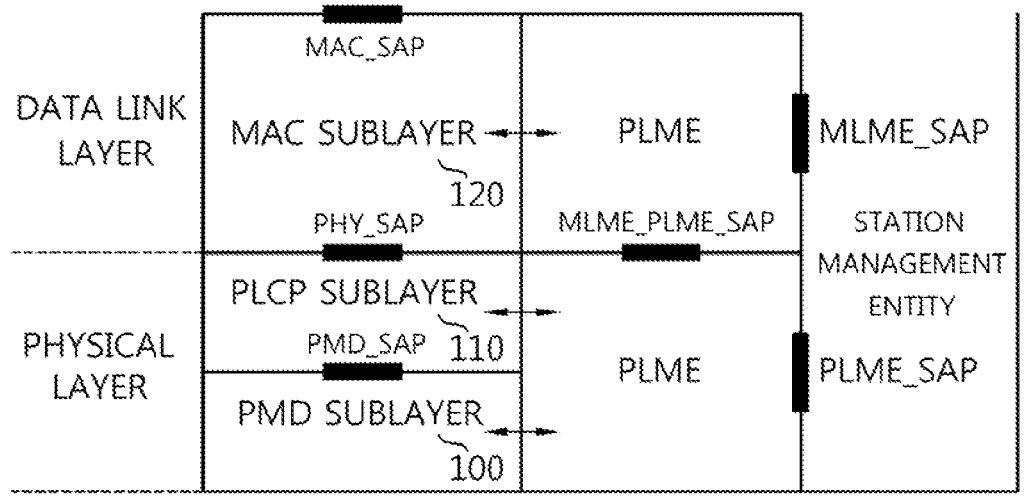
FIG. 1 is a diagram showing the PHY layer architecture of IEEE 802.11.

FIG. 1 is a diagram showing the PHY layer architecture of IEEE 802.11.

The PHY layer architecture of IEEE 802.11 consists of a PHY Layer Management Entity (PLME), a Physical Layer Convergence Procedure (PLCP) sublayer 110, and a Physical Medium Dependent (PMD) sublayer 100. The PLME provides a function of managing the physical layer in cooperation with a MAC Layer Management Entity (MLME). The PLCP sublayer 110 transfers a MAC Protocol Data Unit (MPDU), received from a MAC sublayer 120, to the PMD sublayer 100 or a frame, received from the PMD sublayer 100, to the MAC sublayer 120 between the MAC sublayer 120 and the PMD sublayer 100 according to the instruction of the MAC layer 120. The PMD sublayer 100 is a lower layer of the PLCP, and it enables the transmission and reception of a physical layer entity between two STAs through a radio medium.

In a process of receiving an MPDU from the MAC sublayer 120 and transferring the MPDU to the PMD sublayer 100, the PLCP sublayer 110 adds a supplementary field, including information necessary for a physical layer transceiver, to the MPDU. The supplementary field can be a PLCP preamble in the MPDU, a PLCP header, or tail bits necessary for a data field. The PLCP preamble functions to synchronize a receiver and to make the receiver prepare for antenna diversity, before a PLCP Service Data Unit (PSDU) (=MPDU) is transmitted to the receiver. The PLCP header includes a field including information about a frame. The PLCP is described in more detail later with reference to FIG. 2.

The PLCP sublayer 110 generates a PLCP Protocol Data Unit (PPDU) by adding the above-described field to the MPDU and transmits the PPDU to a reception station via the PMD sublayer 100. The reception station receives the PPDU, obtains information necessary for data restoration from a PLCP preamble and a PLCP header, and restores data on the basis of the obtained data.

Figure 2:
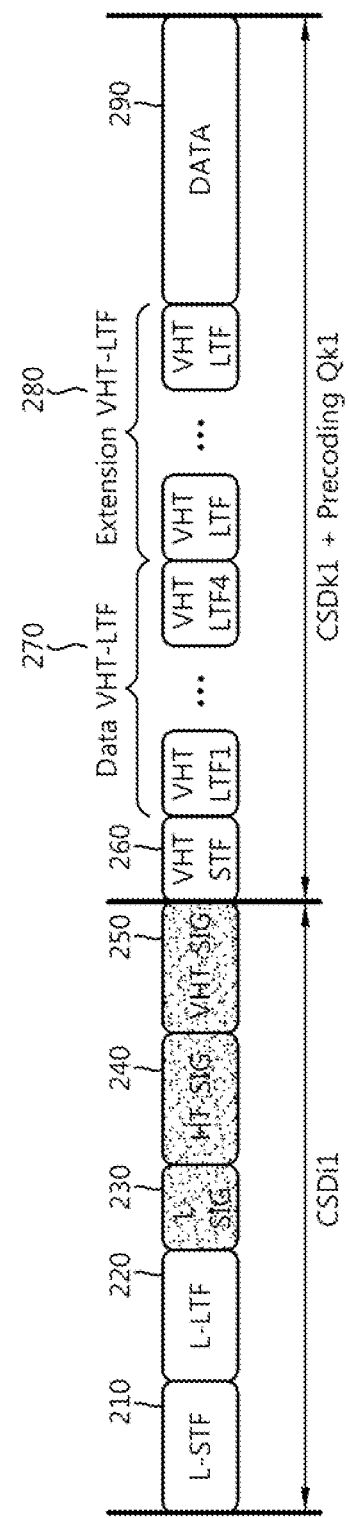
FIG. 2 is a block diagram showing an example of a VHT mixed PLCP frame format which supports the SU-MIMO mode in a WLAN system in which an L-STA, an HT-STA, and a VHT-STA coexist.

FIG. 2 is a block diagram showing an example of a VHT mixed PLCP frame format which supports the SU-MIMO mode in a WLAN system in which an L-STA, an HT-STA, and a VHT-STA coexist.

The VHT mixed PLCP frame can include an L-STF field 210, an L-LTF field 220, an L-SIG field 230, an HT-SIG field 240, a VHT-SIG field 250, a VHT STF field 260, data VHT-LTF fields 270, an extension VHT-LTF field 280, and a data field 290.

The PLCP sublayer transforms an MPDU, received from an MAC layer, into the data field 290 of FIG. 2 by adding necessary information to the MPDU, generates a PPDU frame 200 by adding fields, such as the L-STF field 210, the L-LTF field 220, the L-SIG field 230, the HT-SIG field 240, the VHT-SIG field 250, the VHT STF field 260, the data VHT-LTF fields 270, and the extension VHT-LTF field 280, to the data field 290, and transmits the PPDU frame 200 to one or more STAs through the PMD layer.

The L-STF field 210 is used for frame timing acquisition, Automatic Gain Control (AGC) control, coarse frequency acquisition, and so on.

The L-LTF field 220 is used in channel estimation for the demodulation of the L-SIG field 230, the HT-SIG field 240, and the VHT-SIG field 250.

The fields up to the VHT-SIG field 250 are not subjected to beam-forming and transmitted so that they can be received and recognized by all STAs including an L-STA. The fields transmitted after the VHT-SIG field 250, such as the VHT STF field 260, the data VHT-LTF fields 270, the extension VHT-LTF field 280, and the data field 290, can be subjected to precoding and beam-forming and then transmitted.

The VHT-STF field 260 is used for a VHT-STA to improve AGC estimation and for an STA, receiving the VHT-STF field 260, to take a portion where transmission power is varied because of precoding into consideration.

The plurality of data VHT-LTF fields 270 is used for channel estimation for the demodulation of the data field 290. Additionally, the extension VHT-LTF field 280 for channel sounding can be used.

A Short Training Field (STF), such as the L-STF field 210 and the VHT STF field 260, is used for frame timing acquisition, AGC control, and so on and thus also called a synchronization signal or a synchronization channel. That is, the STF is used to synchronize STAs or an STA and an AP.

A Long Training Field (LTF), such as the L-LTF field 220 and the data VHT-LTF fields 270, is used for channel estimation for the demodulation of data or control information or both and thus also called a reference signal, a training signal, or a pilot.

The L-SIG field 230, the HT-SIG field 240, and the VHT-SIG field 250 provide various pieces of information necessary for the demodulation and decoding of data and thus also called control information.

The VHT SIG field 250 can include at least one of fields listed in Table 1, for example.

TABLE 1

| Field Name | Description |
| --- | --- |
| MU-MIMO Indicator | Indicate whether MU-MIMO is used or can toggle SU-MIMO/MU-MIMO. |
| Bandwidth | Indicate the bandwidth of a channel |
| VHT Length | Indicate the number of data octets of a PSDU |
| STA Indicator | Indicate a receiving STA. Indicate the address of an STA or ID information about an STA, such as AID |
| Multiplexing Number | Indicate the number of STAs (or users) multiplexed by MU-MIMO |
| Decoding Indicator | Indicate information for decoding data |
| MCS | Indicate Modulation and Coding Scheme (MCS) information necessary to decode data |
| Short GI | Indicate whether a short Guard Interval (GI) is used. |
| Number of Extension Spatial Streams | Indicate the number of extension spatial streams |
| CRC | Indicate a check value for checking whether there is error in transmitted data |
| Tail Bits | Used in the trellis termination of a convolution coder |

In Table 1, the field names are only illustrative, and names different from the above field names can be used. The fields of Table 1 are only illustrative. For example, some of the fields in Table 1 can be omitted, and other fields can be further added to the fields of Table 1. Furthermore, the PPDU frame according to the PPDU frame format illustrated in FIG. 2 is generated in the PLCP sublayer of an STA and transmitted to a transmission destination STA via the PMD sublayer. Some of the fields of the PPDU frame of FIG. 2 can be omitted, or other fields can be added to the fields of the PPDU frame of FIG. 2.

Figure 3:
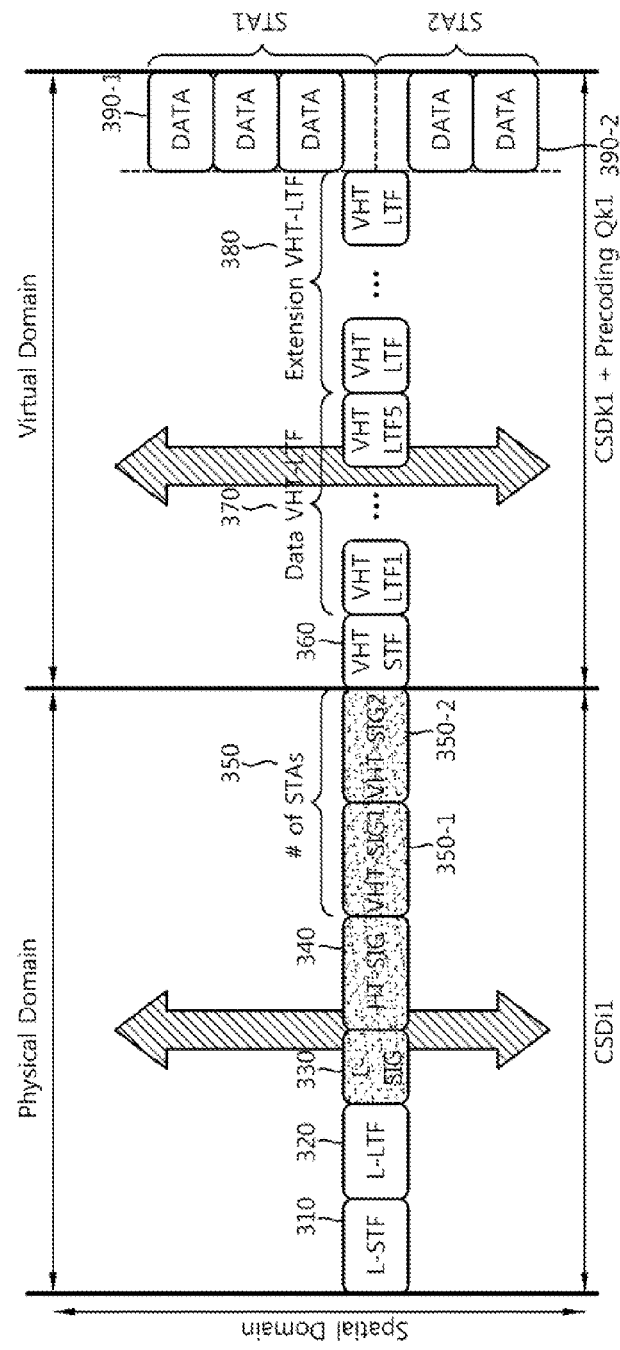
FIG. 3 is a block diagram showing an example of a VHT mixed PLCP frame format which supports the MU-MIMO mode in a WLAN system in which an L-STA, an HT-STA, and a VHT-STA coexist.

FIG. 3 is a block diagram showing an example of a VHT mixed PLCP frame format which supports the MU-MIMO mode in a WLAN system in which an L-STA, an HT-STA, and a VHT-STA coexist.

The VHT mixed PLCP frame can include an L-STF field 310, an L-LTF field 320, an L-SIG field 330, an HT-SIG field 340, a plurality of VHT-SIG fields 350, a VHT STF field 360, data VHT-LTF fields 370, extension VHT-LTF fields 380, and a data field 390.

The function of each of the fields is the same as that of FIG. 2. Unlike the VHT mixed PLCP frame format of FIG. 2, the VHT mixed PLCP frame format of FIG. 3, supporting the MU-MIMO mode in which data is transmitted to a plurality of destination STAs at the same time, has the plurality of VHT-SIG fields 350.

FIG. 3 illustrates a case where an AP performs MU-MIMO transmission to an STA1 and an STA2. In FIG. 3, two VHT-SIG fields (i.e., a VHT-SIG1 field 350-1 and a VHT-SIG2 field 350-2) are used. The VHT-SIG1 field 350-1 and the VHT-SIG2 field 350-2 include control information about the STA1 and the STA2, respectively. That is, the PLCP frame format supporting the MU-MIMO mode can have the same number of VHT-SIG fields as destination STAs.

Furthermore, in FIG. 3, the AP transmits data to the STA 1 by using three spatial streams 390-1 and data to the STA 2 by using two spatial streams 390-2. FIG. 3 illustrates a case where a total of five spatial streams are used. In this case, a VHT-LTF field can be included in each of the spatial streams, and thus the data VHT-LTF fields 370 can consist of five VHT-LTFs fields in FIG. 3.

As can be seen from the VHT mixed PLCP frame formats shown in FIGS. 2 and 3, in general, the L-SIG field 330 for the L-STA and the HT-SIG field 340 for the HT-STA are transmitted earlier than the VHT-SIG field 350 for a VHT-STA in order to support backward compatibility with an L-STA and an HT-STA.

Here, the operations of the STAs are described below. The L-STA reads the L-SIG field 330 from the received PLCP frame and performs detection assuming that the received PLCP frame is its own data packet. However, the L-STA has received the PLCP frame transmitted in a data format for an HT STA, including the HT-SIG field which is not data that can be accepted (or recognized) by the L-STA. Consequently, if CRC check is performed on a result of demodulation and decoding performed assuming that the PLCP frame has a format for the L-STA, error occurs. Such an operation can occur even in the case of the HT-STA. Like the L-STA, the HT-STA reads the L-SIG field and the HT-SIG field, recognizes fields subsequent to the VHT-SIG field, transmitted after the HT-SIG field, as the HT-LTF field, etc., assuming that data is transmitted in a form for the HT STA, and receives the fields. Consequently, a result of demodulation and decoding for the PLCP frame has error in a result of CRC check.

However, in order to satisfy backward compatibility, to always consecutively transmit the three SIG fields (i.e., the L-SIG field, the HT-SIG field, and the VHT-SIG field) in the VHT mixed PLCP frame as described above is not preferred in that it increases preamble overhead. If, in order to reduce preamble overhead, the three SIG fields are not consecutively transmitted and the HT-SIG field of the three SIG fields is not transmitted (in other words, only the L-SIG field and the VHT-SIG field are transmitted), preamble overhead of 8 μs can be reduced. Here, in case where the HT-SIG field including control information for the HT-STA is not transmitted in order to reduce preamble overhead, there is a possibility that the HT-STA can malfunction. Accordingly, there is a need for a solution for such malfunction.

There is proposed a method of configuring a VHT mixed PLCP frame and setting up fields, wherein an HT-STA which has received the VHT mixed PLCP frame in which only an L-SIG field and a VHT-SIG field except an HT-SIG field are transmitted in order to reduce preamble overhead can normally recognize that the VHT mixed PLCP frame is not its own data packet without malfunction.

According to an embodiment of the method of configuring the VHT mixed PLCP frame and setting up the fields, proposed by the present invention, CRC bits included in the VHT-SIG field are set up such that a result of CRC error is obtained when an HT-STA performs CRC check on the CRC bits.

For example, a CRC polynomial used for the CRC check can be set up differently from a CRC polynomial for the HT-SIG field, and the value of CRC bits included in the VHT-SIG field can be determined by performing CRC calculation on the basis of the different CRC polynomial.

An AP transmits a PLCP frame, including the L-SIG field and the VHT-SIG field, except the HT-SIG field. Here, the VHT-SIG field can include CRC bits, obtained on the basis of a new CRC polynomial, as a subfield. An HT-STA which has received the VHT mixed PLCP frame according to an embodiment of the present invention from which the HT-SIG field has been omitted obtains a result of CRC error as the result of CRC check performed on the basis of a conventional CRC polynomial used by the HT-STA. Accordingly, the HT-STA can know that the VHT mixed PLCP frame is not data having a format for the HT-STA.

According to another embodiment of the present invention in which an HT-STA which has received a VHT mixed PLCP frame obtains a result of CRC error as the result of CRC check on an HT-SIG field, a CRC polynomial for the CRC check on the HT-SIG field is used, but the CRC bits of a VHT-SIG field are obtained by performing an XOR (i.e., exclusive OR) operation of CRC parity bits and a specific bit pattern (hereinafter, referred to as 'CRC masking'). The VHT-SIG field, including the CRC bits obtained by the CRC masking, generates CRC error to the HT-STA, but the VHT-STA can be normally operated.

In this case, an identifier (ID) for identifying an STA, such as an STA ID or an Association ID (AID) of the VHT-STA, can be used as the specific bit pattern subjected to the XOR operation with the CRC parity bits. The HT-STA which has received the VHT-SIG field, including the CRC bits obtained by CRC masking performed on the AID, recognizes the CRC error as a simple CRC error because it does not know whether the CRC masking has been performed and thus can know that the VHT-SIG field is not data having a format for the HT-STA.

The VHT-SIG field is set up such that an HT-STA which has received the VHT-SIG field according to another embodiment of the present invention recognizes the VHT-SIG field as having a data format for an L-STA and operates.

In a method of setting up the VHT-SIG field according to an embodiment of the present invention, a constellation for the VHT-SIG field is newly defined and used so that the HT-STA which has received the VHT-SIG field recognizes the VHT-SIG field as having a data format for an L-STA and operates.

Figure 4:
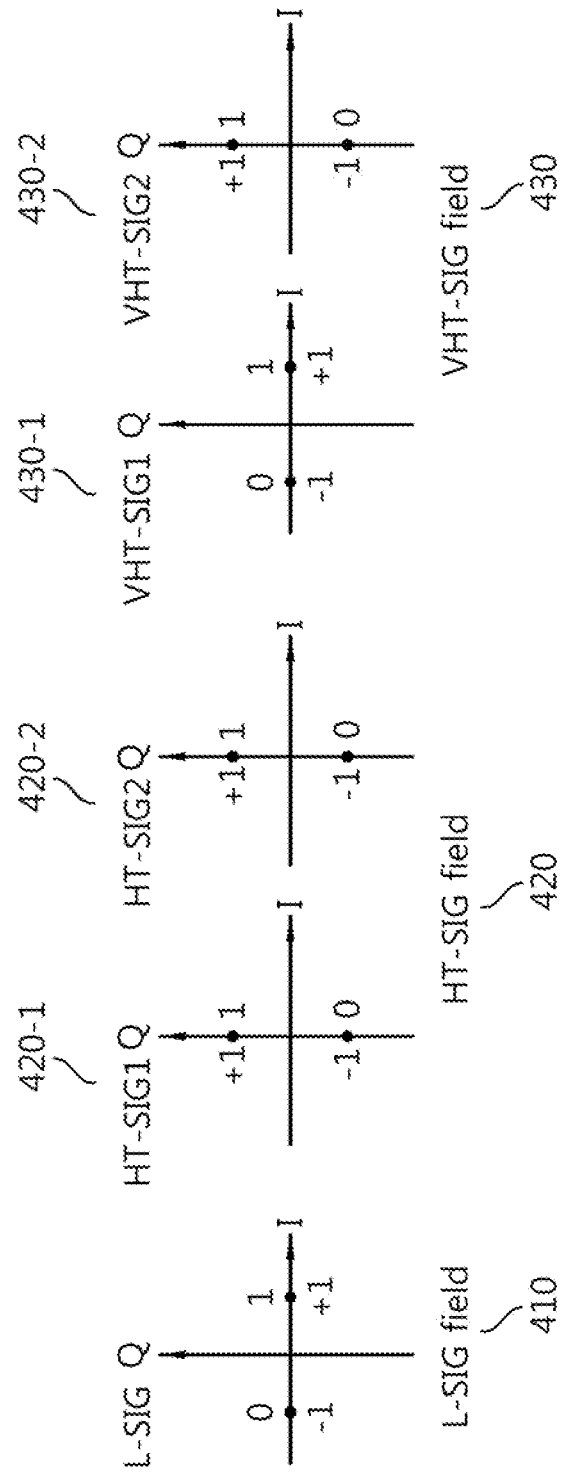
FIG. 4 is a diagram showing constellations which are used in an L-SIG field and an HT-SIG field and an example of a constellation which can be used in a VHT-SIG field according to the present invention.

FIG. 4 is a diagram showing constellations which are used in an L-SIG field and an HT-SIG field, respectively, and an example of a constellation which can be used in a VHT-SIG field according to the present invention.

Referring to FIG. 4, an L-STA reads the L-SIG field 410 composed of one 4 μs SIG field, and an HT-STA read the HT-SIG field 420 composed of a 4 μs HT-SIG1 field 420-1 and a 4 µs HT-SIG2 field 420-2. The constellation used in the L-SIG field 410 as in FIG. 4 is BPSK, and the HT-SIG1 field 420-1 and the HT-SIG2 field 420-2, each having 24 bits, are subjected to quadrature BPSK (QBPSK) modulation.

The constellation of the VHT-SIG field 430 shown in FIG. 4 is an example of the constellation of the VHT-SIG field according to an embodiment of the present invention. The VHT-SIG field 430 according to the embodiment of the present invention can be composed of a VHT-SIG1 field 430-1 and a VHT-SIG2 field 430-2. BPSK is used as a modulation method applied to the VHT-SIG field, but the VHT-SIG field 430 can be transmitted as a combination of BPSK constellations differently rotated per VHT-SIG OFDM symbol.

The example of FIG. 4 shows an example in which BPSK is applied to the constellation of the first OFDM symbol VHT-SIG1 430-1 of the VHT-SIG field 430 and a BPSK constellation rotated 90° is applied to the constellation of the second OFDM symbol VHT-SIG2 430-2 of the VHT-SIG field 430. If the above constellations are used, an HT-STA reads a VHT-SIG field and does not recognize the read VHT-SIG field as HT-SIG field. In order for the HT-STA to recognize the VHT-SIG field as HT-SIG field, it is required that the VHT-SIG1 430-1 and the VHT-SIG2 430-2 be subjected to QBPSK modulation or at least VHT-SIG1 430-1 be subjected to QBPSK modulation although it is determine whether an HT-SIG field is an HT-SIG field by using only the VHT-SIG1 430-1 according to an example of a method of implementing an STA. However, the VHT-STA can know that a received PLCP frame format has a format for the VHT-STA through the rotated constellation of the VHT-SIG2 430-2 because it already knows whether a constellation has been rotated and the degree of rotation.

Figure 5:
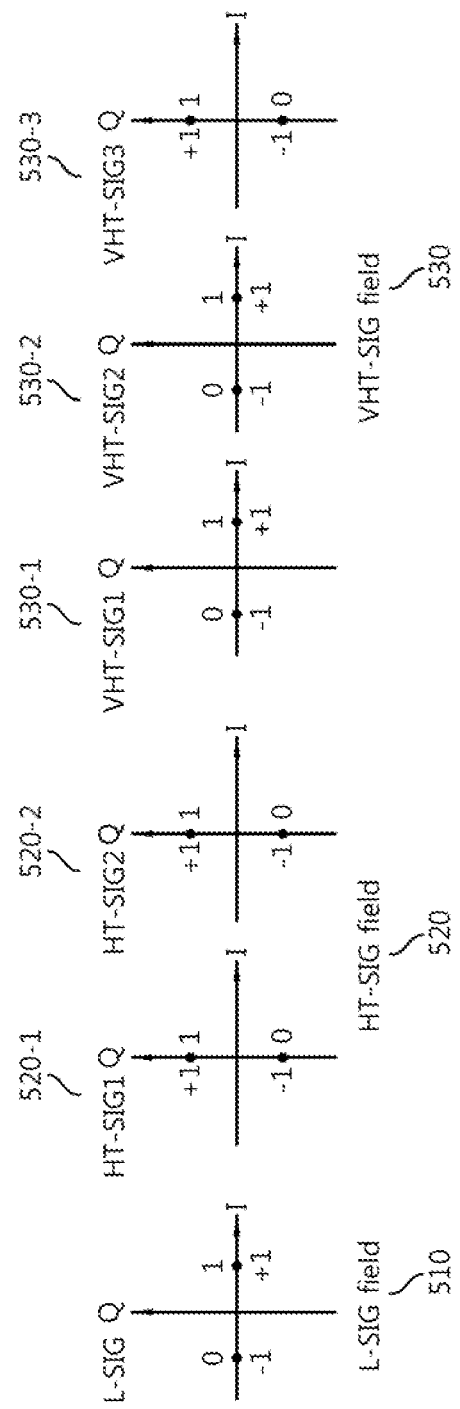
FIG. 5 is a diagram showing constellations which are used in an L-SIG field and an HT-SIG field and another example of a constellation which can be used in a VHT-SIG field according to the present invention.

FIG. 5 is a diagram showing constellations which are used in an L-SIG field and an HT-SIG field, respectively, and another example of a constellation which can be used in a VHT-SIG field according to the present invention.

In a VHT WLAN system, QPSK, 16QAM, 64QAM, and control information bits necessary to support 256QAM and eight or more spatial streams can be greater than 48 bits. In case where ½ code-rate channel encoding applied to an HT-SIG field is used in order to make a maximum the transmission coverage of control information, the number of OFDM symbols (when 20 MHz and 24 subcarriers are used) is three. In this case, a VHT-SIG field 530 can include three OFDM symbols (i.e., VHT-SIG1 530-1, VHT-SIG2 530-2, and VHT-SIG3 530-3.

As in the example of FIG. 4, BPSK is used as a modulation method applied to the VHT-SIG field 530, but the VHT-SIG field 530 can be transmitted as a combination of BPSK constellations differently rotated per VHT-SIG OFDM symbol. The degree of rotation can have a different angle for each symbol, and some of the degrees of rotation can have the same value. The example of FIG. 5 shows a case where a BPSK modulation method has been applied to the VHT-SIG1 530-1 and the VHT-SIG2 530-2 and a QBPSK modulation method has been applied to the VHT-SIG3 530-3. An HT-STA does not recognize the VHT-SIG1 530-1 and the VHT-SIG2 530-2 as having a PLCP frame format for the HT-STA because the VHT-SIG1 530-1 and the VHT-SIG2 530-2 have not been subjected to QBPSK modulation. However, the VHT-STA can know that a received PLCP frame format has a format for the VHT-STA through the rotated constellations of the VHT-SIG2 530-2 or the VHT-SIG3 530-3 or both because it already know whether the constellations have been rotated and the degree of rotation.

Figure 6:
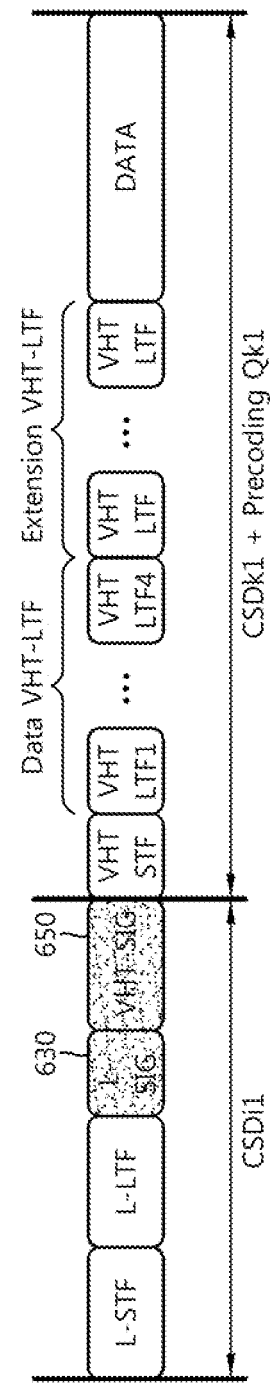
FIG. 6 is a block diagram showing a VHT mixed PLCP frame format supporting the SU-MIMO mode according to an embodiment of the present invention.
Figure 7:
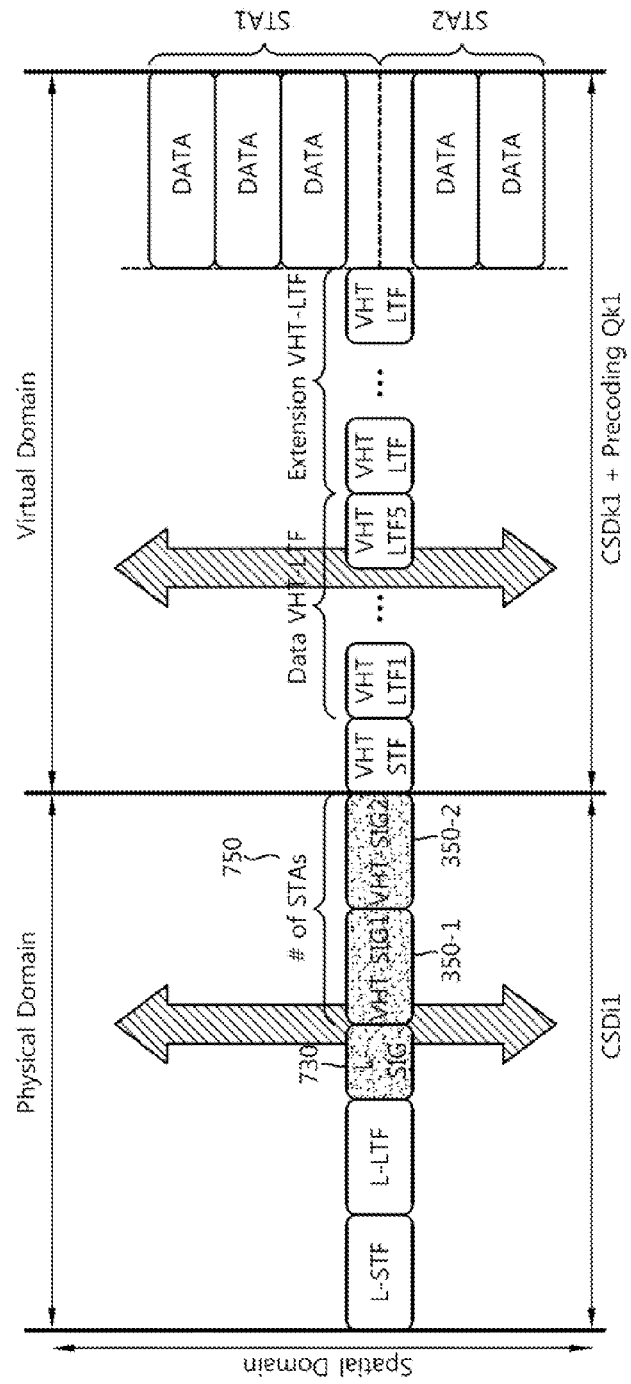
FIG. 7 is a block diagram showing a VHT mixed PLCP frame format supporting the MU-MIMO mode according to an embodiment of the present invention.

FIGS. 6 and 7 are block diagrams showing a VHT mixed PLCP frame format supporting the SU-MIMO mode and a VHT mixed PLCP frame format supporting the MU-MIMO mode, respectively, according to an embodiment of the present invention.

It can be seen that unlike the VHT mixed PLCP frame format of FIG. 2, the VHT mixed PLCP frame format of FIG. 6 has an HT-SIG field omitted between an L-SIG field 630 and a VHT-SIG field 650. It can also be seen that unlike the VHT mixed PLCP frame format of FIG. 3, the VHT mixed PLCP frame format of FIG. 7 has an HT-SIG field omitted between an L-SIG field 730 and VHT-SIG fields 750.

A possible malfunction of an HT-STA which has received the VHT mixed PLCP frame from which the HT-SIG field has been omitted according to the embodiment of the present invention can be solved by using the method of generating CRC error through the set-up of CRC bits included in the VHT-SIG field and the method of configuring the VHT-SIG field as a combination of the rotated BPSK constellations. The methods can be used independently or together.

In the method of configuring the VHT-SIG field as a combination of the rotated BPSK constellations, a VHT-SIG symbol is configured by using two or three BPSK constellations for an L-STA or a first VHT-SIG symbol VHT-SIG1 is maintained to constellation BPSK of an L-SIG field, and then a second VHT-SIG symbol VHT-SIG2 transmitted after the first VHT-SIG symbol VHT-SIG1 (i.e., a VHT-SIG2 and a VHT-SIG3 in case where the VHT-SIG field is composed of three symbols) is configured by using a rotated L-SIG constellation (i.e., BPSK constellation). This is because in order for an HT-STA not to malfunction when receiving a VHT mixed PLCP frame from which an HT-SIG field having a format, such as that of FIG. 6 or 7, has been omitted, the first VHT-SIG symbol VHT SIG1 has to be maintained to the constellation of an L-SIG symbol. Here, a constellation rotated 180° from the constellation of an L-SIG symbol can be used as the first VHT-SIG symbol VHT SIG1. Even in this case, an HT-STA can determine that the symbol has a PLCP frame format for (or supporting) an L-STA because a constellation of the symbol has not been shifted by 90° and operate.

According to another embodiment of the present invention, the malfunction of an HT-STA can be prevented by using a pilot included in the OFDM symbol of a VHT-SIG field. A VHT-STA can distinguish SIG fields by using a pilot or can distinguish SIG fields by using a pilot and determining whether a symbol constellation of the SIG field has been rotated.

Four subcarriers in each OFDM symbol of a channel having a bandwidth of 20 MHz consist of a pilot signal. The pilot signal can be modulated into a BPSK constellation and placed in indices −21, −7, 7, and 21.

[Equation 1]

$$P_{(i_{STS},n)}^{-28,28} = \{0, 0, 0, 0, 0, 0, 0, \Psi_{i_{STS},n\oplus 4}^{(N_{STS})}, 0, 0, 0, 0, 0, 0, 0, 0, 0, 0, 0, 0,$$
$$\Psi_{i_{STS},(n+1)\oplus 4}^{(N_{STS})}, 0, 0, 0, 0, 0, 0, 0, 0, 0, 0, 0, 0, 0, \Psi_{i_{STS},(n+2)\oplus 4}^{(N_{STS})}, 0,$$
$$0, 0, 0, 0, 0, 0, 0, 0, 0, 0, 0, 0, \Psi_{i_{STS},(n+3)\oplus 4}^{(N_{STS})}, 0, 0, 0, 0, 0, 0, 0\}$$

Equation 1 represents a pilot sequence for an $n^{th}$ symbol and an $i_{STS}^{th}$ Space Time Stream (STS). Here, n indicates a symbol number, $\oplus$ indicates a modulo operator, and $n \oplus a$ is the remainder obtained by dividing n by a. A pattern of a pilot $\Psi_{i_{STS},n}^{(N_{STS})}$ is defined as in Table 2.

TABLE 2

| $N_{STS}$ | $i_{STS}$ | $\Psi_{i_{STS}0}^{(N_{STS})}$ | $\Psi_{i_{STS}1}^{(N_{STS})}$ | $\Psi_{i_{STS}2}^{(N_{STS})}$ | $\Psi_{i_{STS}3}^{(N_{STS})}$ |
|---|---|---|---|---|---|
| 1 | 1 | 1 | 1 | 1 | -1 |
| 2 | 1 | 1 | 1 | -1 | -1 |
| 2 | 2 | 1 | -1 | -1 | 1 |
| 3 | 1 | 1 | 1 | -1 | -1 |
| 3 | 2 | 1 | -1 | 1 | -1 |
| 3 | 3 | -1 | 1 | 1 | -1 |
| 4 | 1 | 1 | 1 | 1 | -1 |
| 4 | 2 | 1 | 1 | -1 | 1 |
| 4 | 3 | 1 | -1 | 1 | 1 |
| 4 | 4 | -1 | 1 | 1 | 1 |

According to an embodiment of the present invention, a BPSK constellation used for a pilot is used as a rotated BPSK constellation in case where the BPSK constellation is applied to a pilot for a VHT SIG field. For example, a BPSK constellation rotated 180° can be applied to a VHT-SIG field. The degree of rotation can be set up in various ways, and the present invention is not limited to the degree of rotation and the number of pilots included in each OFDM symbol. OFDM symbols in a channel having a bandwidth of 20 MHz including four pilots are described below as an example. However, the technical spirit of the present invention can also be applied to a case where a channel having a channel bandwidth of 40 MHz, 80 MHz, or 80 MHz or higher, composed of subcarriers 6 or more of which include a pilot in an OFDM symbol.

According to embodiments, a receiving STA can know the type of an SIG field by using one pilot, from among symbols constituting the SIG field, or can accurately know the type of an SIG field by using a pilot of two or three symbols constituting the SIG field.

A method of distinguishing the types of SIG fields by using a pilot according to an embodiment of the present invention can be performed as follows.

In the case in which a BPSK constellation rotated 180° is used as a constellation applied to a pilot according to an embodiment of the present invention, the pilot can be represented by using two kinds of methods.

The first method is a method of rotating a pilot itself 180°. A pilot proposed by the present invention can use {0,0, . . . ,0,-1,0, . . . , 0,-1,0, . . . ,0,-1,0, . . . ,0,1,0, . . . ,0} in which pilot values placed at indices -21, -7, 7, and 21 have been changed from 1 to -1 and from -1 to 1, which is a result of the pilot itself rotated 180°.

The second method is a method of rotating a scrambling sequence 180°. In this method, scrambling is performed by using a 180° rotated scrambling sequence which can be conventionally obtained by multiplying the scrambling sequence by -1.

In the method of a receiving STA distinguishing SIG fields by using a pilot of an OFDM symbol, the receiving STA can distinguish the SIG fields by using a correlation of pilots or a phase difference between an LTF field and a pilot.

Figure 8:
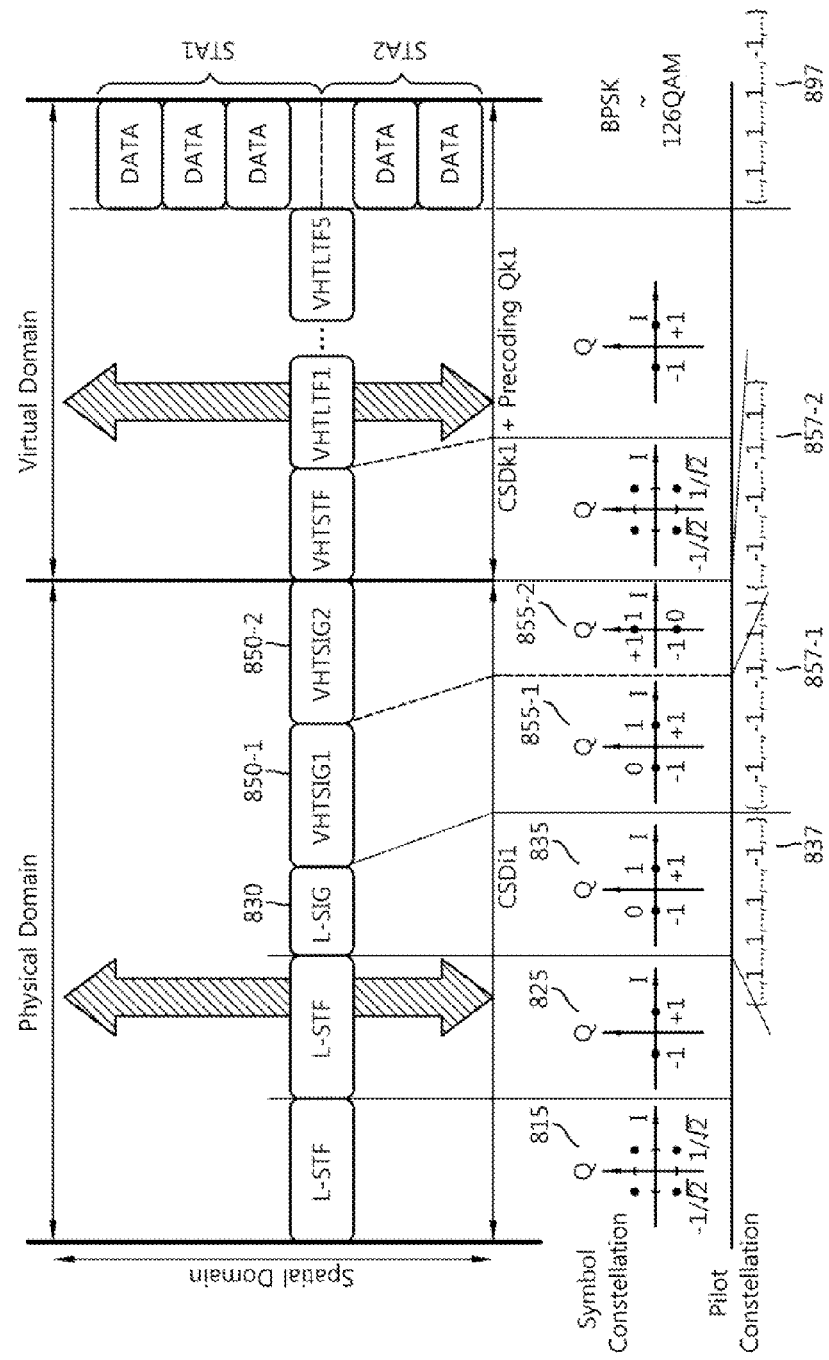
FIG. 8 shows an example of constellations for symbols and constellations for pilots, of each field of a PLCP frame according to an embodiment of the present invention.

FIG. 8 shows an example of constellations for symbols and constellations for pilots, of each field of a PLCP frame according to an embodiment of the present invention.

The example of FIG. 8 corresponds to another embodiment of the present invention described with reference to FIG. 4. From FIG. 8, it can be seen that the constellation 835 of an L-SIG field 830 is used as the symbol constellation 855-1 of a VHT-SIG1 symbol 850-1, and the constellation 835 of the L-SIG field 830 which has been rotated is used as the symbol constellation 855-2 of a VHT-SIG2 symbol 850-2.

The pilot of the present invention exists in the SIG field and the data field. In marking the pilot sequence in FIG. 8, {0,0, . . . ,0,1,0, . . . , 0,1,0, . . . ,0,1,0, . . . ,0,-1,0, . . . ,0} is simply represented by using only the pilot values placed at the indices -21, -7, 7, and 21 in the form of { . . . , 1, . . . , 1, . . . , 1,-1, . . . } with 0 being omitted.

It can be seen that the pilot constellation 857-1 of the VHT SIG1 symbol 850-1 and the symbol constellation 857-2 of the VHT SIG2 symbol 850-2 have been rotated 180°, as compared with the pilot constellation 837 of the L-SIG field 830.

An HT-STA which has received a VHT mixed PCLP frame, such as that shown in the example of FIG. 8, recognizes that the PLCP frame received from the constellation 835 of the L-SIG field 830 and the constellation 855-1 of the VHT-SIG1 symbol 850-1 has a frame format supporting an L-STA and then operates. Furthermore, an HT-STA which has received a VHT mixed PCLP frame can recognize that the PLCP frame received from the pilot constellation 857-1 of the VHT SIG1 symbol 850-1, rotated 180°, and the symbol constellation 857-2 of the VHT SIG2 symbol 850-2 does not have a frame format for the HT-STA.

Figure 9:
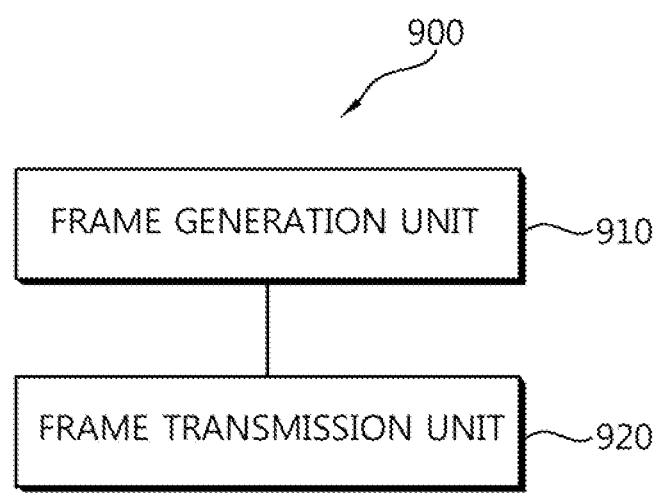
FIG. 9 is a block diagram of a wireless apparatus in which an embodiment of the present invention is implemented.

FIG. 9 is a block diagram of a wireless apparatus in which an embodiment of the present invention is implemented. The wireless apparatus 900 can be a part of a non-AP STA or an AP.

The wireless apparatus 900 includes a frame generation unit 910 and a frame transmission unit 920. The frame generation unit 910 generates the VHT mixed PLCP frame according to the above-described embodiments. Here, the CRC bits of a VHT SIG field included in the PLCP header of the VHT mixed PLCP frame can be set up such that they generate error as the result of CRC check performed by an HT-STA which has received the VHT mixed PLCP frame. Furthermore, the constellation or the pilot of the VHT-SIG field can be set up by using the above-described methods. The frame transmission unit 920 transmits the generated VHT mixed PLCP frame to one or more wireless apparatuses.

The frame generation unit 910 and the frame transmission unit 920 can be implemented in one chip in the form of a processor. Each of the embodiments in which a frame is generated can be implemented in a software module, stored in memory, and executed by a processor.

According to an embodiment of the present invention, an SU-MIMO mode and an MU-MIMO mode can be effectively supported, preamble overhead can be reduced, and at the same time the malfunction of a legacy STA and an HT STA can be prevented. Accordingly, the coexistence of a VHT STA, the legacy STA, and the HT STA can be guaranteed.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of transmitting data in a wireless local area network, performed by a transmitter, the method comprising:
   mapping a signal field onto a first binary phase shift keying (BPSK) constellation;
   mapping a first Very High Throughput Signal (VHT-SIG) field onto the first BPSK constellation;
   mapping a second VHT-SIG field onto a second BPSK constellation;
   transmitting the mapped signal field in a first Orthogonal Frequency Division Multiplex (OFDM) symbol;
   transmitting the mapped first VHT-SIG field in a second OFDM symbol; and
   transmitting the mapped second VHT-SIG field in a third OFDM symbol, wherein the second OFDM symbol is contiguous with the third OFDM symbol, wherein the second BSPK constellation is rotated by 90° counter-clockwise relative to the first BPSK constellation, and wherein the first VHT-SIG field includes an indicator indicating Single User-Multiple Input Multiple Output (SU-MIMO) transmission or multi user-MIMO (MU-MIMO) transmission, and the second VHT-SIG field includes a cyclic redundancy check (CRC) for the first and second VHT-SIG fields.

2. The method of claim 1, wherein the signal field, the first VHT-SIG field and the second VHT-SIG field are included in a physical layer convergence procedure (PLCP) header.

3. The method of claim 1, wherein the first VHT-SIG field further includes a multiplexing number indicating a number of spatial streams.

4. A wireless apparatus configured for transmitting data in a wireless local area network, the wireless apparatus comprising:

a frame generation unit configured for mapping a signal field onto a first binary phase shift keying (BPSK) constellation, mapping a first Very High Throuhput Signal (VHT-SIG) field onto the first BPSK constellation and mapping a second VHT-SIG field onto a second BPSK constellation; and a frame transmission unit configured for transmitting the mapped signal field in a first Orthogonal Frequency Division Multiplex (OFDM) symbol, transmitting the mapped first VHT-SIG field in a second OFDM symbol and transmitting the mapped second VHT-SIG field in a third OFDM symbol, wherein the second OFDM symbol is contiguous with the third OFDM symbol, wherein the second BSPK constellation is rotated by 90° counter-clockwise relative to the first BPSK constellation, and wherein the first VHT-SIG field includes an indicator indicating Single User-Multiple Input Multiple Output (SU-MIMO) transmission or multi user-MIMO (MU-MIMO) transmission, and the second VHT-SIG field includes a cyclic redundancy check (CRC) for the first and second VHT-SIG fields.

5. The wireless apparatus of claim 4, wherein the first VHT-SIG field further includes a multiplexing number indicating a number of spatial streams.

* * * * *